(12) United States Patent
Lai

(10) Patent No.: US 7,672,177 B2  
(45) Date of Patent: Mar. 2, 2010

(54) MEMORY DEVICE AND METHOD THEREOF

(75) Inventor: Chien-Hung Lai, Taipei (TW)

(73) Assignee: Via Technologies, Inc., Taipei (TW)

( * ) Notice: Subject to any disclaimer, the term of this patent is extended or adjusted under 35 U.S.C. 154(b) by 338 days.

(21) Appl. No.: 11/930,540

(22) Filed: Oct. 31, 2007

(65) Prior Publication Data
US 2008/0106962 A1 May 8, 2008

(30) Foreign Application Priority Data
Nov. 2, 2006 (TW) .............................. 95140574 A

(51) Int. Cl.
*G11C 7/00* (2006.01)
*G11C 8/00* (2006.01)
(52) U.S. Cl. .................. 365/191; 365/203; 365/233.1
(58) Field of Classification Search ............. 365/191, 365/233.1
See application file for complete search history.

(56) References Cited

U.S. PATENT DOCUMENTS

| | | | | |
|---|---|---|---|---|
| 5,261,064 | A * | 11/1993 | Wyland | 711/211 |
| 7,543,250 | B1 * | 6/2009 | Kizhepat et al. | 716/1 |
| 2001/0007538 | A1 * | 7/2001 | Leung | 365/222 |
| 2005/0005082 | A1 * | 1/2005 | Au et al. | 711/170 |
| 2005/0108505 | A1 * | 5/2005 | Boutaud | 712/205 |
| 2006/0221945 | A1 * | 10/2006 | Chin et al. | 370/381 |

\* cited by examiner

*Primary Examiner*—Ly D Pham
(74) *Attorney, Agent, or Firm*—Thomas, Kayden, Horstemeyer & Risley

(57) ABSTRACT

A memory device and a method thereof. The memory described includes a control module and a single-port memory array. The control circuit generates control signals according to a clock signal, a read command signal and a write command signal. The single-port memory array is accessed according to the control signals.

17 Claims, 8 Drawing Sheets

MEMORY DEVICE AND METHOD THEREOF

BACKGROUND OF THE INVENTION

1. Field of the Invention

The invention relates to a memory device and in particular to a memory device with dual command access ability.

2. Description of the Related Art

There are two kinds of different memory devices, one is single-port memory device having single access port, and the other is dual-port memory device having two access ports. FIG. 1A shows a schematic circuit of a single-port memory device 100 including a single-port memory array 110 which is accessed according to a pre-charge signal PRE1 and an enable signal EN1. In single-port memory device 100, the pre-charge signal PRE1 and the enable signal EN1 are active while the clock signal CLK triggers. In other words, the control signal PRE1 and EN1 are asserted once in every clock cycle. Therefore, one command, either a read command or a write command, can be accessed in one clock cycle in the single access port.

FIG. 1B shows a schematic circuit of a dual-port memory device 200 including a dual-port memory array 210 which is accessed according to two sets of control signals PRE2, EN2, PRE3 and EN3. The two sets of control signals are active in the similar way of the single-port memory device 100. However, since the dual-port memory device 200 has two access ports, synchronously data read and data write can be achieved. For example, while two sets of pre-charge signals PRE2 and PRE3 and enable signals EN2 and EN3 are asserted, a read command can be accessed in one access port according to the control signal PRE2 and EN2; a write command can be accessed in the other access port according to the control signal PRE3 and EN3. In other words, while one data is written to an address of the dual-port memory array 210, another data can be read from another address therein.

Although synchronously data read and data write is benefited in dual-port memory device 200, the structure is more complicated than the single-port memory device 100 and the number of transistors is also much.

BRIEF SUMMARY OF THE INVENTION

A detailed description is given in the following embodiments with reference to the accompanying drawings.

According to an embodiment of the invention, a memory device is provided in the present invention. The memory device includes: a single-port memory array; and a control module generating a plurality of control signals according to a clock signal, a read command signal and a write command signal; wherein the single-port memory array is accessed according to the control signals; wherein the single-port memory array is accessed at least once a clock cycle.

Also provided is a memory access method which includes: generating a plurality of control signals according to a clock signal, a read command signal and a write command signal; and accessing the memory array at least once a clock cycle according to the control signals; wherein the read command signal is triggered while a read command is asserted, and the write command signal is triggered while a write command is triggered.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The present invention provides a single-port memory device with dual command access ability.

Figure 1A:
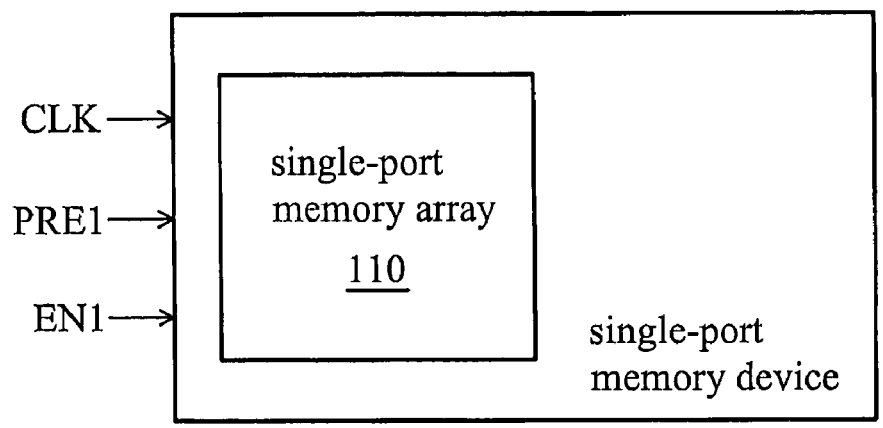
FIG. 1A is a schematic diagram of a single-port memory device.
Figure 1B:
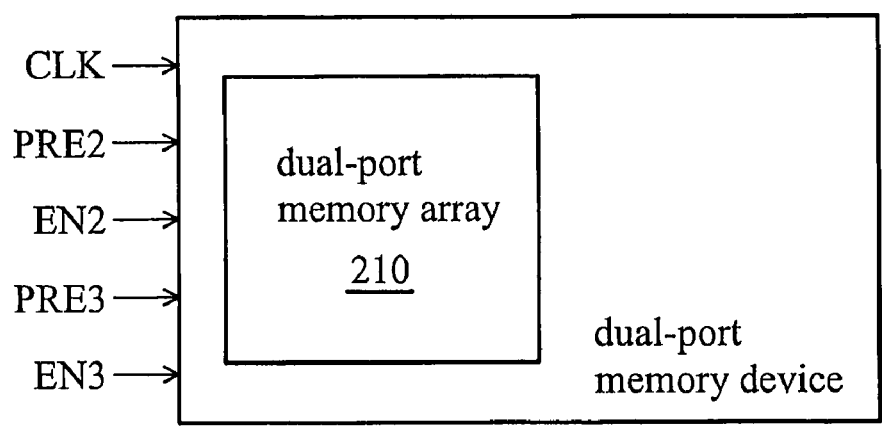
FIG. 1B is a schematic diagram of a dual-port memory device
Figure 2:
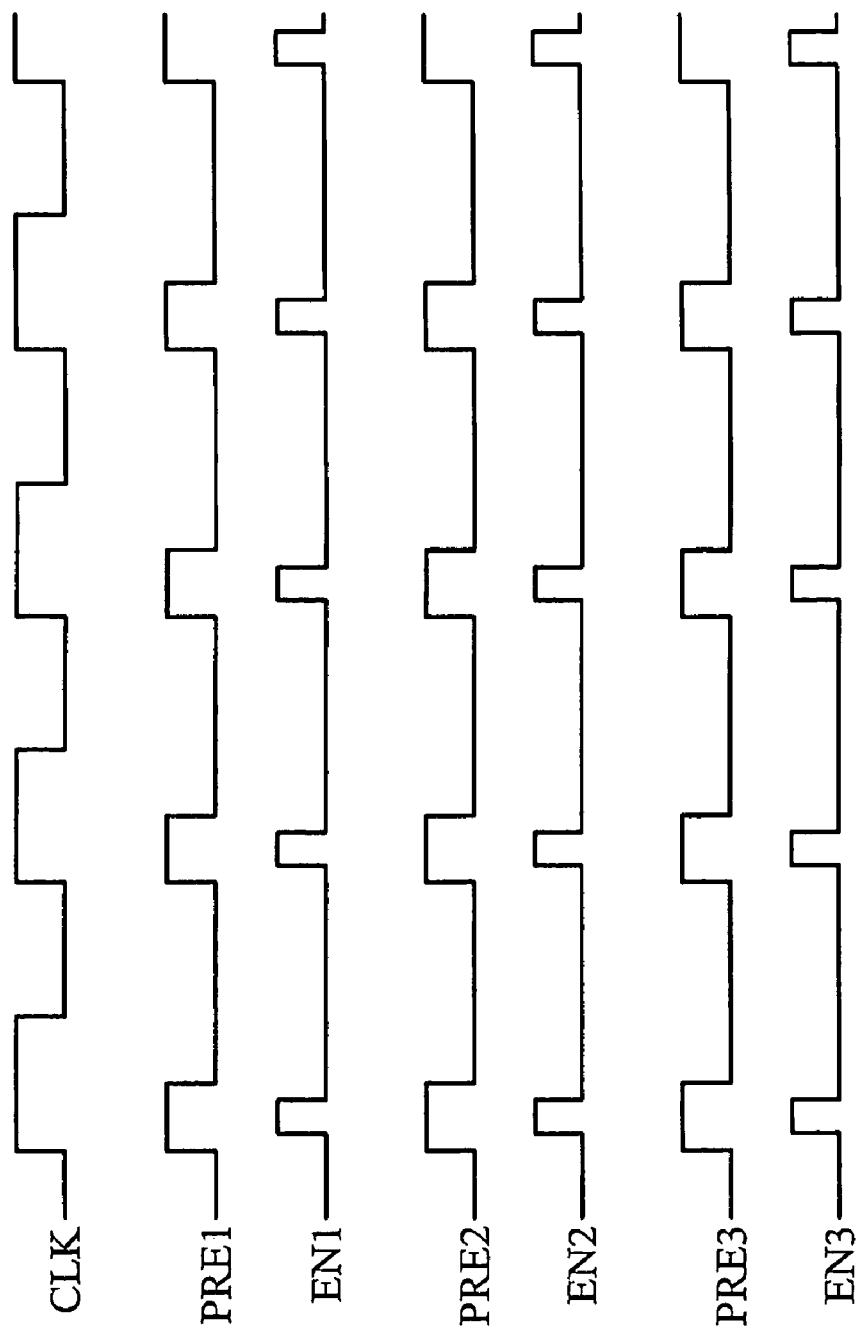
FIG. 2 is a timing diagram of related signals of single-port memory device.
Figure 3:
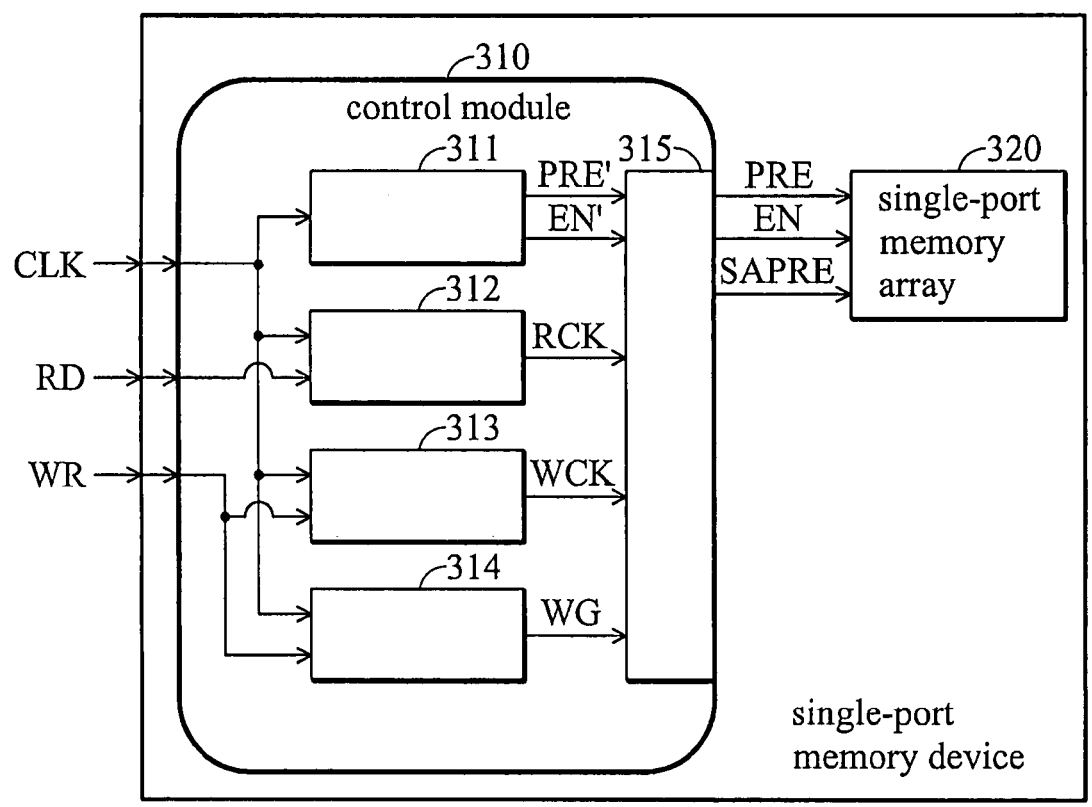
FIG. 3 is a block diagram of a single-port memory device of the present invention.

FIG. 3 is a block diagram of exemplary single-port memory device 300 according to the invention. The single-port memory device 300 includes a control module 310 and a single-port memory array 320. In the present invent, the single-port memory array is accessed according to a pre-charge signal PRE and an enable signal EN which is provided by the control module 310.

The control module 310 includes a master circuit 311 which receives a clock signal CLK and generates a primary pre-charge signal PRE' and a primary enable signal EN'. In the present invention, the primary pre-charge signal PRE' and a primary enable signal EN' are enabled twice in one clock cycle; therefore, the single-port memory device 300 of the invention can synchronously access a read command and a write command in one clock cycle. Furthermore, the control module 310 also includes: read clock generating circuit 312, write clock generating circuit 313, gating circuit 314 and combination circuit 315. The read clock generating circuit 312 provides a read clock signal RCK according to a read command signal RD and clock signal CLK. The read clock signal RCK is active while read command signal RD is triggered; and the read clock signal RCK is inactive while read command signal RD is not triggered. The write clock generating circuit 313 provides a write clock signal WCK according to a write command signal WR and clock signal CLK. The write clock signal WCK is active while write command signal WR is triggered; and the write clock signal WCK is inactive while write command signal WR is not triggered. The gating circuit 314 provides a write gating signal WG according to write command signal WR and clock signal CLK. The write gating signal WG is active while write command signal WR is triggered; and the write gating signal WG is inactive while write command signal WR is not triggered. The combination circuit 315 generated a pre-charge signal PRE, a enable signal EN and a pre-charge signal of sense amplifier SAPRE according to the primary pre-charge signal PRE', the primary enable signal EN', read clock signal RCK and write gating signal WG. Therefore, the sing-port memory array 320 can be accessed according to the signals PRE, SAPRE and EN.

Figure 4:
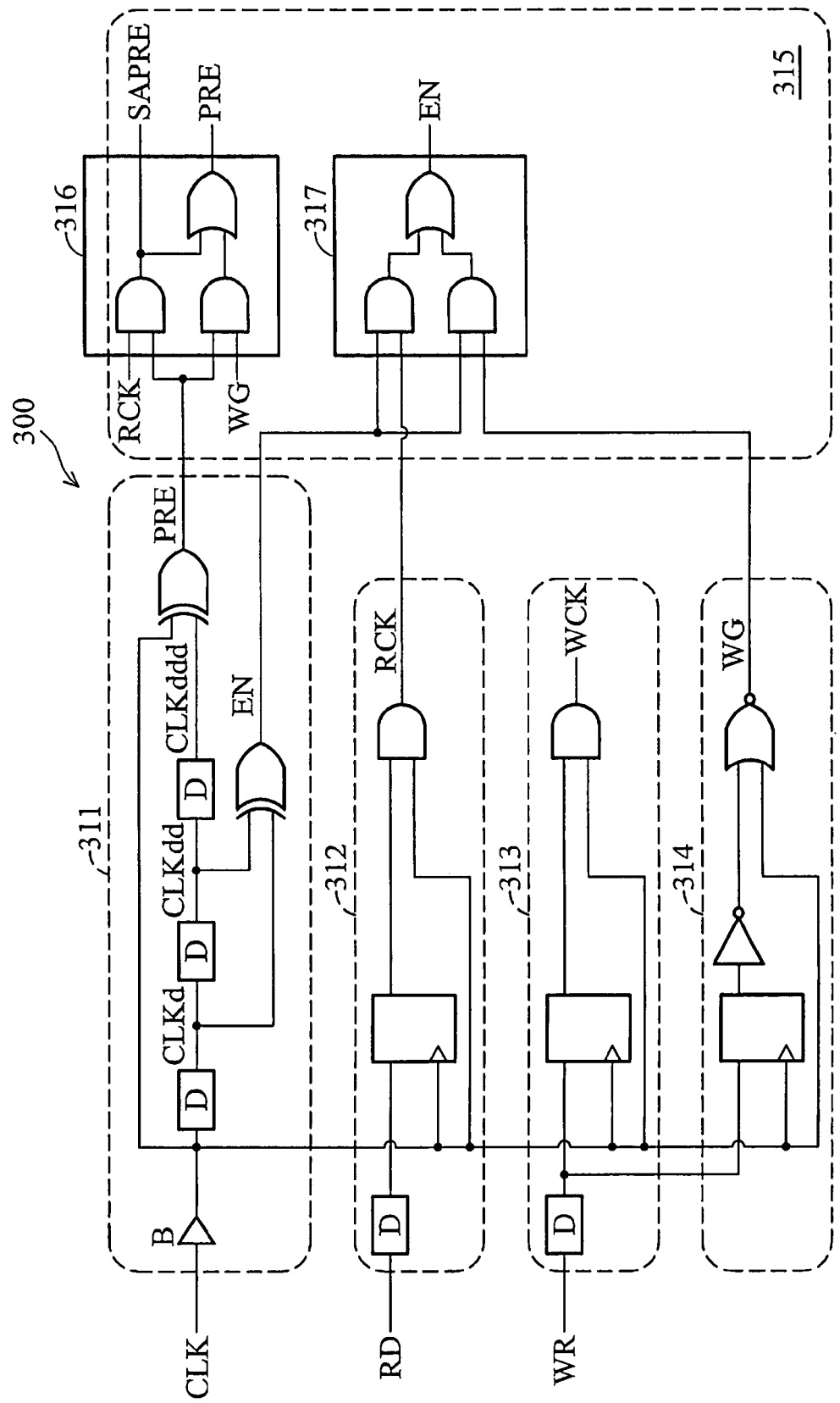
FIG. 4 is a block diagram of a control module of the present invention.

FIG. 4 shows an exemplary diagram of the control module 310 of the present invention.

Figure 5:
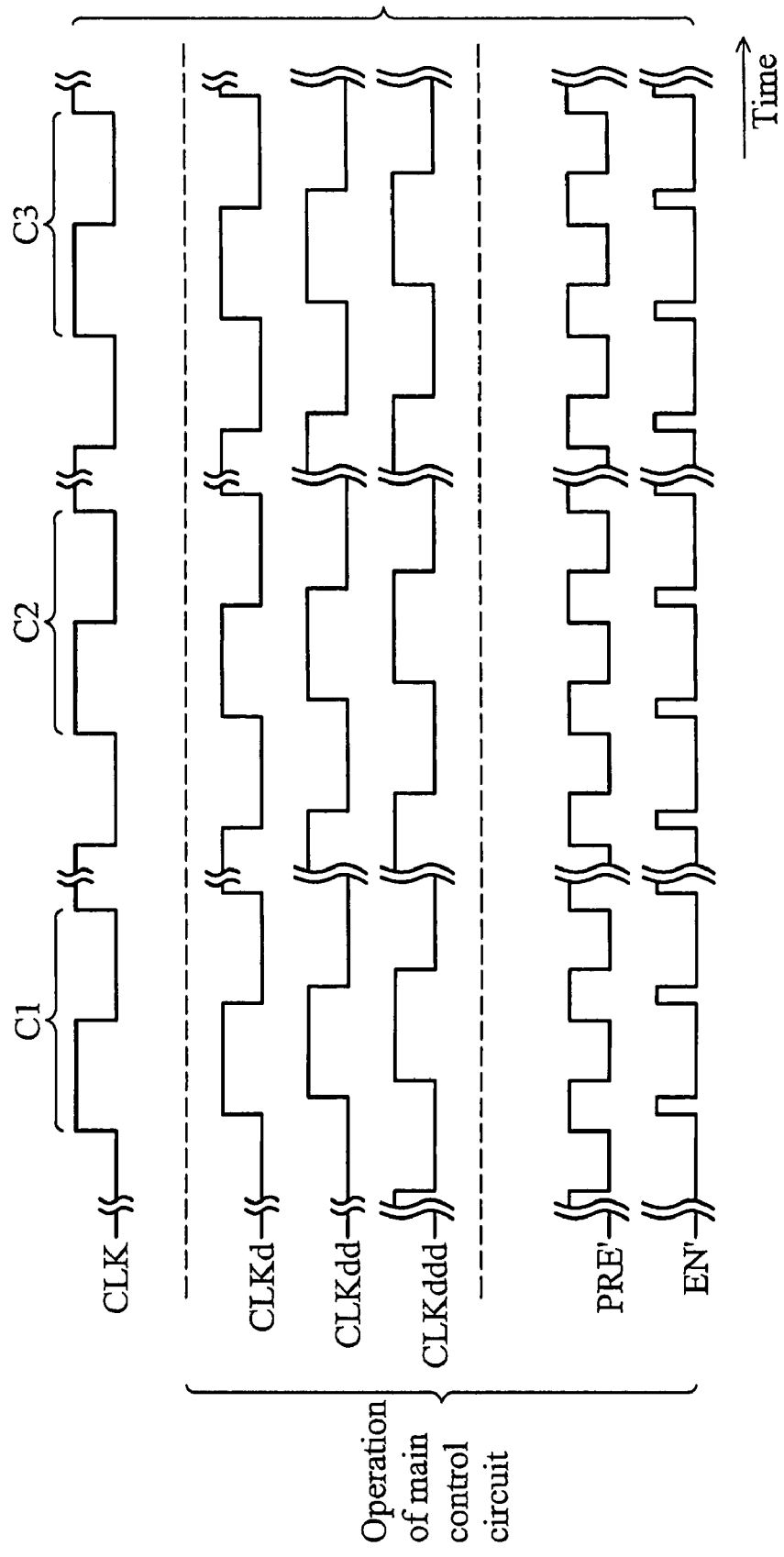
FIG. 5 is a timing diagram of a master circuit.

Refer to FIG. 4, the master circuit 311 includes a buffer, three delay units and two XOR gates. The clock signal is first buffer and then the three delay unit sequentially delay the clock signal CLK to generate a plurality of delayed clock signals CLKd, CLKdd and CLKddd. finally, performing Exclusive-OR logic operation of CLK and CLKddd to generate the primary pre-charge signal PRE'; and performing Exclusive-OR logic operation of CLKd and CLKdd to generate the primary enable signal EN'. FIG. 5 shows a timing diagram of the master circuit 311. It is observed that the primary pre-charge signal PRE' and the primary enable signal EN' are enabled twice a clock cycle; therefore, the single-port memory array can be accessed twice in one clock cycle according to the primary pre-charge signal PRE' and primary enable signal EN'.

Figure 6:
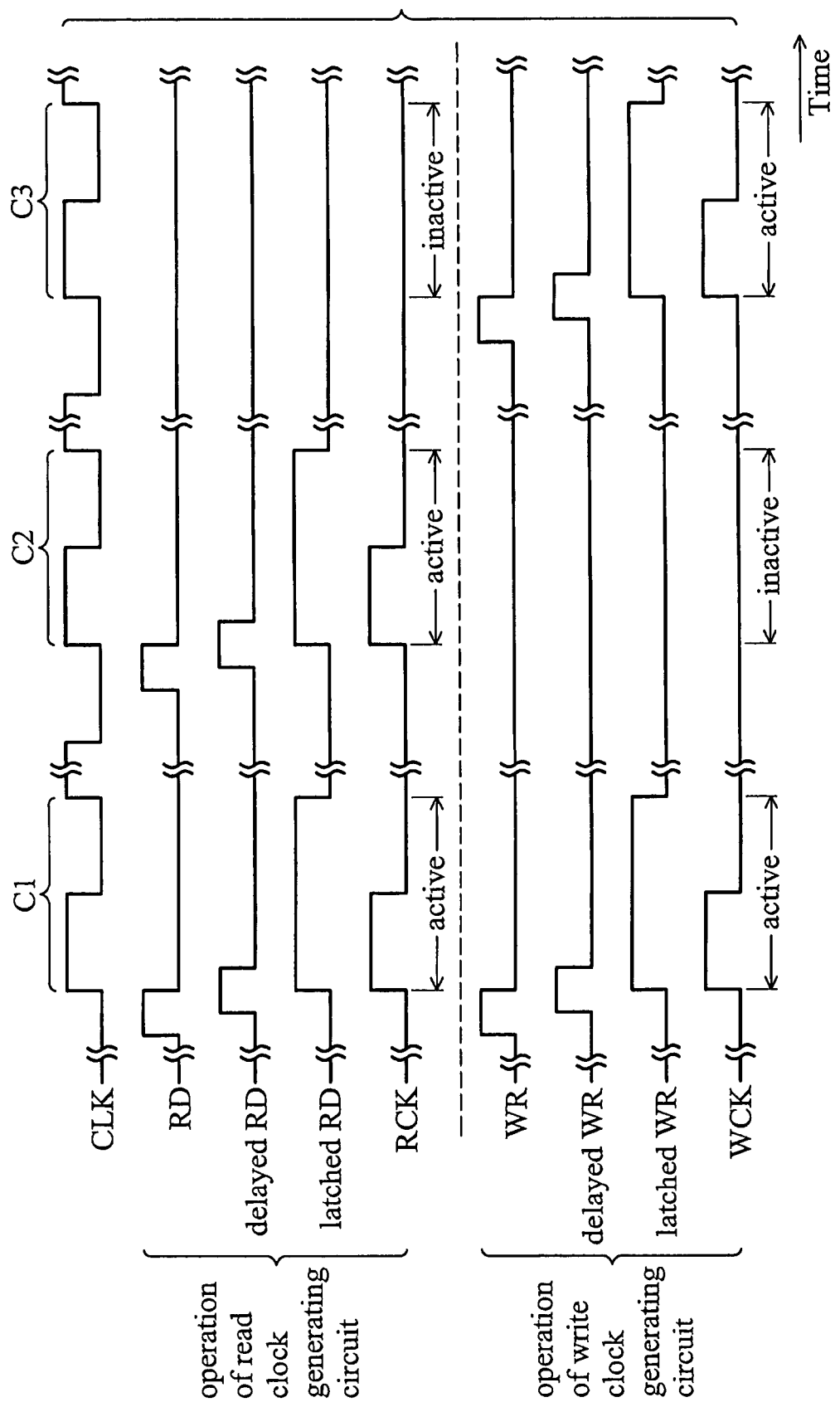
FIG. 6 is a timing diagram of a control module.

Refer to FIG. 4, the read clock generating circuit 312 includes a delay unit for delaying read command signal RD; a latch for latching the delayed read command signal according to the clock signal CLK and a AND gate for performing logic AND operation of the latched read command signal and clock signal CLK to generate the read clock signal RCK. FIG. 6 shows a timing diagram of the read clock generating circuit 312. Assume that the read command signal RD is triggered (i.e. a read command is asserted) at clocks C1 and C2 and not triggered (i.e. no read command is asserted) at clock C3, it is observed that the read clock signal RCK is active in clocks C1 and C2 and inactive in clock C3. Moreover, in the active periods, the read clock signal RCK is enabled (i.e. logic high level) while the clock signal CLK is at logic high level.

Similarly, the write clock generating circuit 313 includes a delay unit for delaying write command signal WR; a latch for latching the delayed write command signal according to the clock signal CLK and a AND gate for performing logic AND operation of the latched write command signal and clock signal CLK to generate the write clock signal WCK. FIG. 6 also shows a timing diagram of the write clock generating circuit 312. Assume that the write command signal WR is triggered (i.e. a write command is asserted) at clocks C1 and C3 and not triggered (i.e. no write command is asserted) at clock C2, it is observed that the write clock signal WCK is active in clocks C1 and C3 and inactive in clock C2. Moreover, in the active periods, the write clock signal WCK is enabled (i.e. logic high level) while the clock signal CLK is at logic high level.

Figure 7:
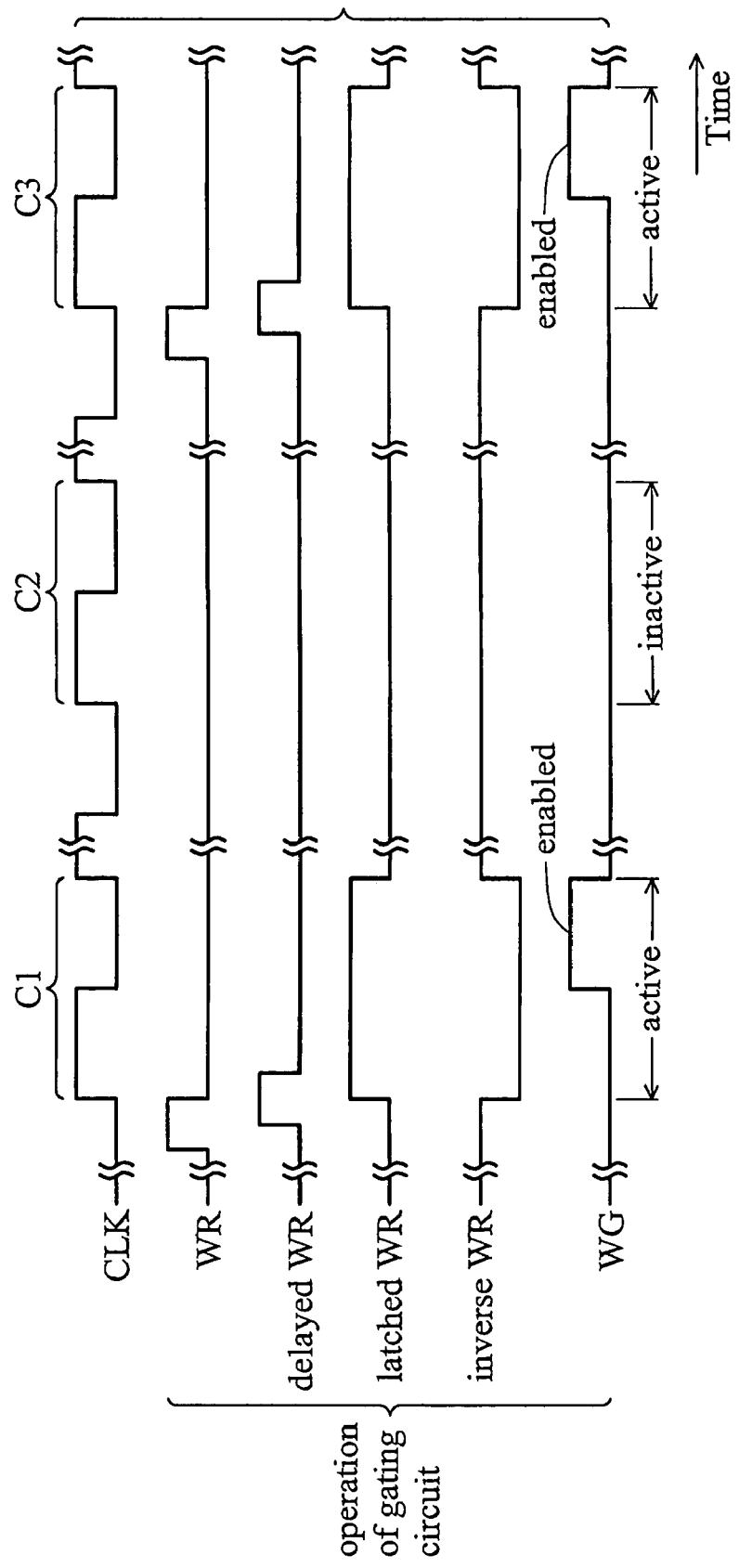
FIG. 7 is another timing diagram of a control module.

Refer to FIG. 4, The gating circuit 314 includes a latch for latching the delayed write command signal according to the clock signal CLK; an inverter for inversing the latched write command signal and a NOR gate for performing logic NOR operation of the latched write command signal and clock signal CLK to generate the write gating signal WG. FIG. 7 shows a timing diagram of the write clock generating circuit 312. Assume that the write command signal WR is triggered (i.e. a write command is asserted) at clocks C1 and C3 and not triggered (i.e. no write command is asserted) at clock C2, it is observed that the write gating signal WG is active in clocks C1 and C3 and inactive in clock C2. Moreover, in the active periods, the write gating signal WG is enabled (i.e. logic high level) while the clock signal CLK is at logic low level.

Refer to FIG. 4, the combination circuit 3150 includes two sets of logic operation circuit 316 and 317. The logic operation circuit 316 includes two AND gates and one OR gate. The logic operation circuit 316 performs logic AND operation of the primary pre-charge signal PRE' and the read clock signal RCK to generate the pre-charge signal of sense amplifier SAPRE. The logic operation circuit 316 also performs logic OR operation to the result of logic AND operation for the primary pre-charge signal PRE' and the write gating signal WG and the pre-charge signal of sense amplifier SAPRE to generate the pre-charge signal PRE. The logic operation circuit 317 includes two AND gates and one OR gate. The logic operation circuit 317 performs logic OR operation to the result of logic AND operation for the primary enable signal EN' and the read clock signal RCK and the result of logic AND operation for the primary enable signal EN' and the write gating signal WG to generate the enable signal EN. Therefore, the single-port memory array can be accessed according to the pre-charge signal PRE, the enable signal EN and the pre-charge signal of sense amplifier SAPRE.

In the present invention, the master circuit 310 continuously triggers the primary pre-charge signal PRE' and the primary enable signal EN' twice in one clock cycle. However, the pre-charge signal PRE and the enable signal EN is triggered according to the read clock signal RCK and the write gating signal WG. In other words, while there are two commands (a read command and a write command) asserted at one time, the pre-charge signal PRE and the enable signal EN are triggered twice a clock cycle; therefore, for example, the read command can be accessed in the first half period of the clock cycle according to the first triggered PRE and EN, and the write command can be accessed in the second half period of the clock cycle according to the second triggered PRE and EN. While there is only one command (either one read command or one write command) asserted at one time, the pre-charge signal PRE and the enable signal EN are triggered once a clock cycle. For example, if a read command is asserted, the PRE and EN are triggered only in the first half period of the clock cycle, and the read command can be accessed according to the triggered PRE and EN in the first half clock cycle. Moreover, if a write command is asserted, the PRE and EN are triggered only in the second half period of the clock cycle, and the write command can be accessed according to the triggered PRE and EN in the second half clock cycle.

Figure 8:
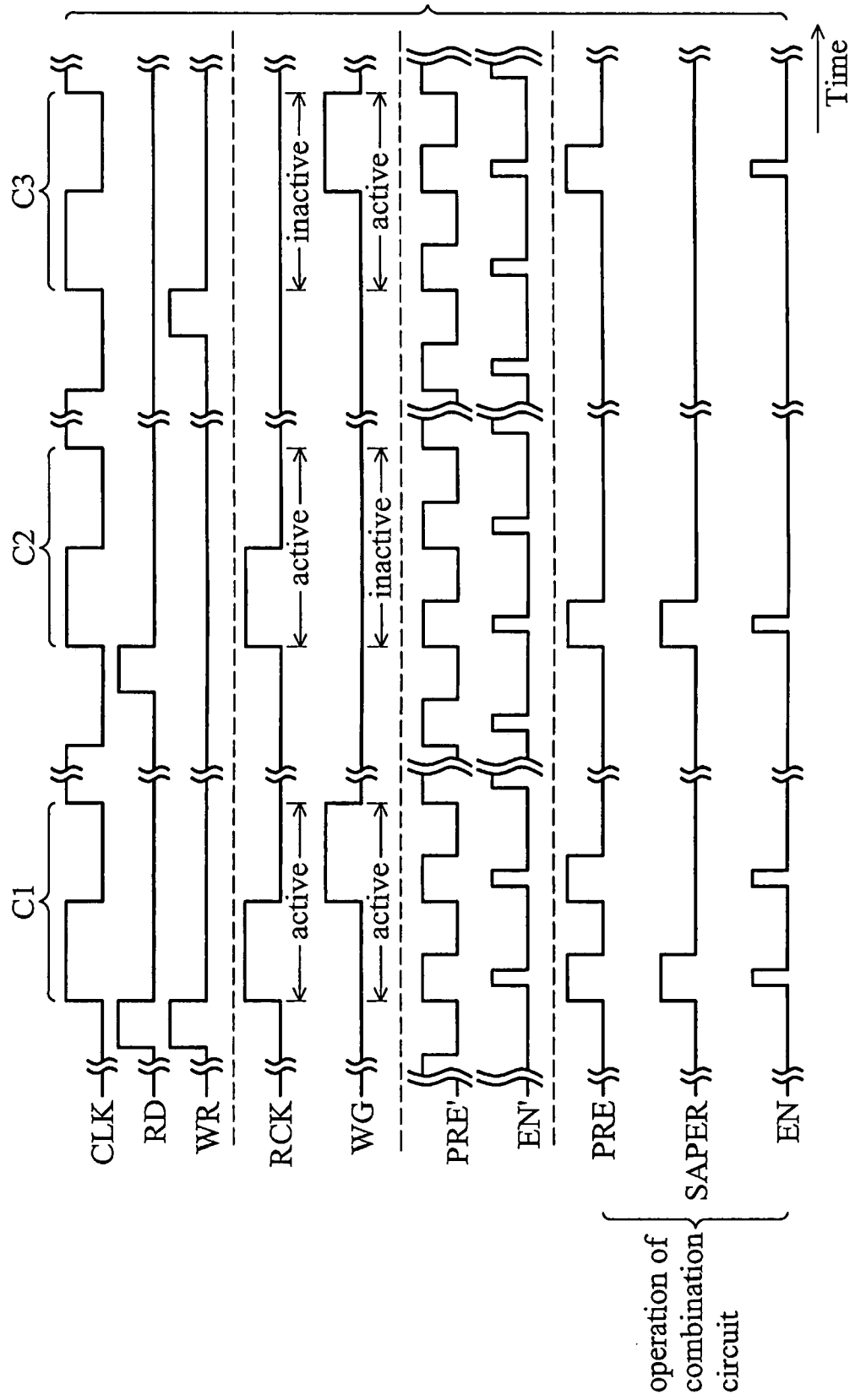
FIG. 8 is a timing diagram of related signals in a combination circuit.

FIG. 8 shows an exemplary timing diagram according to the present invention. Assume that a read command and a write command are both asserted in clock C1, the read clock signal RCK and the write gating signal are active in clock C1; however, the RCK is enable while CLK is at high logic level (i.e. in the first half period of clock C1) and the WG is enable while CLK is at low logic level (i.e. in the second half period of clock C1). It is observed that the pre-charge signal PRE and the enable signal EN are triggered twice in clock C1; therefore, the read command can be accessed in the first half period of clock C1 and the write command can be accessed in the second half period of clock C2.

Assume that only a read command is asserted in clock C2; as a result, the read clock signal RCK is active in clock C2 and enable in the first half period of clock C2; the write gating signal WG is inactive in clock C2. It is observed that the pre-charge signal PRE and the enable signal EN are triggered once in clock C2. In other words, the PRE and the EN are triggered in only first half period of clock C2. Therefore, the read command can be accessed in the first half period of clock C2 according to the triggered PRE and EN.

Assume that only a write command is asserted in clock C3; as a result, the write gating signal WG is active in clock C3 and enable in the second half period of clock C3; the read clock signal RCK is inactive in clock C3. It is observed that the pre-charge signal PRE and the enable signal EN are triggered once in clock C3. In other words, the PRE and the EN are triggered in only second half period of clock C3. Therefore, the write command can be accessed in the second half period of clock C3 according to the triggered PRE and EN.

The single-port memory device disclosed generates various basic control signals according to delayed clock signals CLK and logical operations thereof, to achieve the ability of dual command access in one clock cycle. In comparison to the conventional technology, the single-port memory device has lower cost and more compact size. The disclosure is largely applicable to memory devices with large capacity with respect to space conservation. Each circuit/module in the disclosure may be implemented by equivalent circuits with identical functionality, and the implementation is not limited to the embodiments disclosed. For example, the AND gate may be implemented by an inverted AND gate in series with an inverter.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory device, comprising:
   a single-port memory array; and
   a control module generating a plurality of control signals according to a clock signal, a read command signal and a write command signal; wherein the single-port memory array is accessed according to the control signals; wherein the single port-memory array is accessed at least once a clock cycle,
   wherein the control module comprises:
      a master circuit for generating a primary pre-charge signal and a primary enable signal according to the clock signal;
      a read clock generating circuit for generating a read clock signal according to the clock signal and the read command signal; and
      a write gating circuit for generating a write gating signal according to the clock signal and the write command signal;
      wherein the read command signal is triggered while a read command is asserted, and the write command signal is triggered while a write command is asserted; and
      wherein the primary pre-charge signal and the primary enable signal are triggered twice a clock cycle.

2. The memory device of claim 1 wherein the master circuit comprises:
   a buffer for buffering the clock signal;
   three delay units for sequentially delaying the clock signal to generate a first delayed clock signal, a second delayed clock signal and a third delayed clock signal; and
   two XOR gates for performing XOR operation of the clock signal;
   wherein the primary pre-charge signal is derived from XOR operation of the clock signal and the third delayed clock signal;
   wherein the primary enable signal is derived from XOR operation of the first delayed clock signal and the second delayed clock signal.

3. The memory device of claim 1 wherein the read clock generating circuit comprises:
   a delayed unit for delaying the read command signal;
   a latch for latching the delayed read command signal according to the clock signal; and
   an AND gate for performing logic AND operation of the latched read command signal and the clock signal to generate the read clock signal.

4. The memory device of claim 1 wherein the gating circuit comprises:
   a delayed unit for delaying the write command signal;
   a latch for latching the delayed write command signal according to the clock signal;
   an inverter for inverse the latched write command signal; and
   a NOR gate for performing NOR operation of the latched write command signal and the clock signal to generate the write gating signal.

5. The memory device of claim 1 wherein the control module further comprises a combination circuit for generating the control signals according to the primary pre-charge signal, the primary enable signal, the read clock signal and the write gating signal.

6. The memory device of claim 5, the control signals comprise a pre-charge signal, a enable signal and a pre-charge signal of sense amplifier; wherein the pre-charge signal and the enable signal are triggered twice a clock cycle while the read command and the write command are asserted at one time; wherein the pre-charge signal and the enable signal are triggered once a clock cycle while either the read command or the write command is asserted at one time.

7. The memory device of claim 5 wherein the read command is accessed in the first half period of a clock and the write command is accessed in the second half period of the clock.

8. The memory device of claim 5 wherein the combination circuit comprises:
   a first logic operation circuit for generating a pre-charge signal and a pre-charge signal of sense amplifier according to the primary pre-charge signal, the read clock signal and the write gating signal, the first logic operation circuit comprises:
   two AND gates and a OR gate;
   wherein the pre-charge signal of sense amplifier is derived from logic AND operation of the primary pre-charge signal and the read clock signal; and
   a second logic operation circuit for generation a enable signal according to the primary enable signal, the read clock signal and the write gating signal, the second logic operation circuit comprises:
   two AND gates and a OR gate;
   wherein the pre-charge signal is derived from logic OR operation of the pre-charge signal of sense amplifier and the result of logic AND operation for the primary pre-charge signal and the write gating signal.

9. The memory device of claim 1 wherein the read clock signal is active while the read command signal is triggered and is inactive while the read command signal is not triggered; the write gating signal is active while the write command signal is triggered and is inactive while the write command signal is not triggered.

10. The memory device of claim 9 wherein in the active period, the read clock signal is enabled while the clock signal is at logic high level and the write gating signal is enabled while the clock signal is at logic low level.

11. The memory device of claim 1 wherein the control module further comprises a write clock generating circuit for generating a write clock signal according to the clock signal and the write command signal.

12. A memory access method for accessing a memory array, comprising:
- generating a plurality of control signals according to a clock signal, a read command signal and a write command signal, wherein the read command signal is triggered while a read command is asserted, and the write command signal is triggered while a write command is asserted; and
- accessing the memory array at least once a clock cycle according to the control signals, wherein the control signals are triggered at least once a clock cycle;
- generating a primary pre-charge signal and a primary enable signal according to the clock signal;
- generating a read clock signal according to the clock signal and the read command signal; and
- generating a write gating signal according to the clock signal and the write command signal;
- wherein the primary pre-charge signal and the primary signal are triggered twice a clock cycle.

13. The memory access method of claim 12 wherein the read clock signal is active while the read command signal is triggered, and inactive while the read command signal is not triggered; wherein the write gating signal is active while the write command signal is triggered, and inactive while the write command signal is not triggered.

14. The memory access method of claim 13 wherein in the active period, the read clock signal is enabled while the clock is at logic high level, and the write gating is enabled while the clock signal is at logic low level.

15. The memory access method of claim 12 further comprising:
- generating a pre-charge signal and a pre-charge signal of sense amplifier according to the primary pre-charge signal, the read clock signal and the write gating signal; and
- generating a enable signal according to the primary enable signal, the read clock signal and the write gating signal;
- wherein the control signals comprises the pre-charge signal, the pre-charge signal of sense amplifier and the enable signal.

16. The memory access method of claim 12 wherein the control signals are triggered twice a clock cycle while the read command and the write command are asserted at one time; the control signals are triggered once a clock cycle while either the read command or the write command is asserted at one time.

17. The memory access method of claim 16 wherein the read command is accessed in the first half period of the clock cycle and the write command is accessed in the second half period of the clock cycle.

* * * * *